(12) United States Patent
Jackson et al.

(10) Patent No.: US 12,276,681 B2
(45) Date of Patent: Apr. 15, 2025

(54) POWERLINE LOAD MONITOR AND CONTROL

(71) Applicant: SiliconBrite Technologies, Inc., Santa Clara, CA (US)

(72) Inventors: Cameron Nathan Jackson, Los Gatos, CA (US); Baris Karagozlu, Dublin, CA (US)

(73) Assignee: SiliconBrite Technology, Inc., Santa Clara, CA (US)

( * ) Notice: Subject to any disclaimer, the term of this patent is extended or adjusted under 35 U.S.C. 154(b) by 364 days.

(21) Appl. No.: 17/949,171

(22) Filed: Sep. 20, 2022

(65) Prior Publication Data

US 2023/0089376 A1 Mar. 23, 2023

Related U.S. Application Data

(60) Provisional application No. 63/246,240, filed on Sep. 20, 2021.

(51) Int. Cl.
| | |
|---|---|
| *G01R 19/25* | (2006.01) |
| *G01R 19/175* | (2006.01) |
| *H03K 5/1536* | (2006.01) |
| *H03M 1/12* | (2006.01) |

(52) U.S. Cl.
CPC ....... *G01R 19/2513* (2013.01); *G01R 19/175* (2013.01); *H03K 5/1536* (2013.01); *H03M 1/12* (2013.01)

(58) Field of Classification Search
CPC ... H03M 1/12; G01R 19/175; G01R 19/2513; H03K 5/1536

USPC .......................................................... 702/60
See application file for complete search history.

(56) References Cited

U.S. PATENT DOCUMENTS

| | | | | |
|---|---|---|---|---|
| 7,170,197 B2* | 1/2007 | Lopata | .................. | H02M 3/158 |
| | | | | 307/70 |
| 7,595,569 B2* | 9/2009 | Amerom | .................... | G06F 1/28 |
| | | | | 323/272 |
| 7,898,109 B2* | 3/2011 | Lopata | .................. | H02M 3/158 |
| | | | | 307/65 |
| 7,956,494 B2* | 6/2011 | Amerom | .................... | G06F 1/28 |
| | | | | 323/272 |
| 2013/0103963 A1* | 4/2013 | Chen | .......................... | G06F 1/26 |
| | | | | 713/323 |

* cited by examiner

*Primary Examiner* — John H Le
(74) *Attorney, Agent, or Firm* — André Grouwstra

(57) ABSTRACT

A powerline load monitor has a voltage sense input, a current sense input, a clock input and a data output. It includes first and second ADCs coupled with the voltage sense and current sense input, and coupled with a serial interface. A power manager is coupled with the clock input, the ADCs, and the serial interface. When the power manager receives a first clock, it puts the powerline load monitor in active mode and starts a first timer with a first timeout time. The first and second ADC convert a sensed voltage and a sensed current to digital values for the serial interface. When the serial interface receives a trailing edge of a clock pulse, it outputs a data bit of the digital values. When the first timer times out, the power manager puts the powerline load monitor in a standby mode to save power.

17 Claims, 9 Drawing Sheets

Powerline load monitor with load switch control

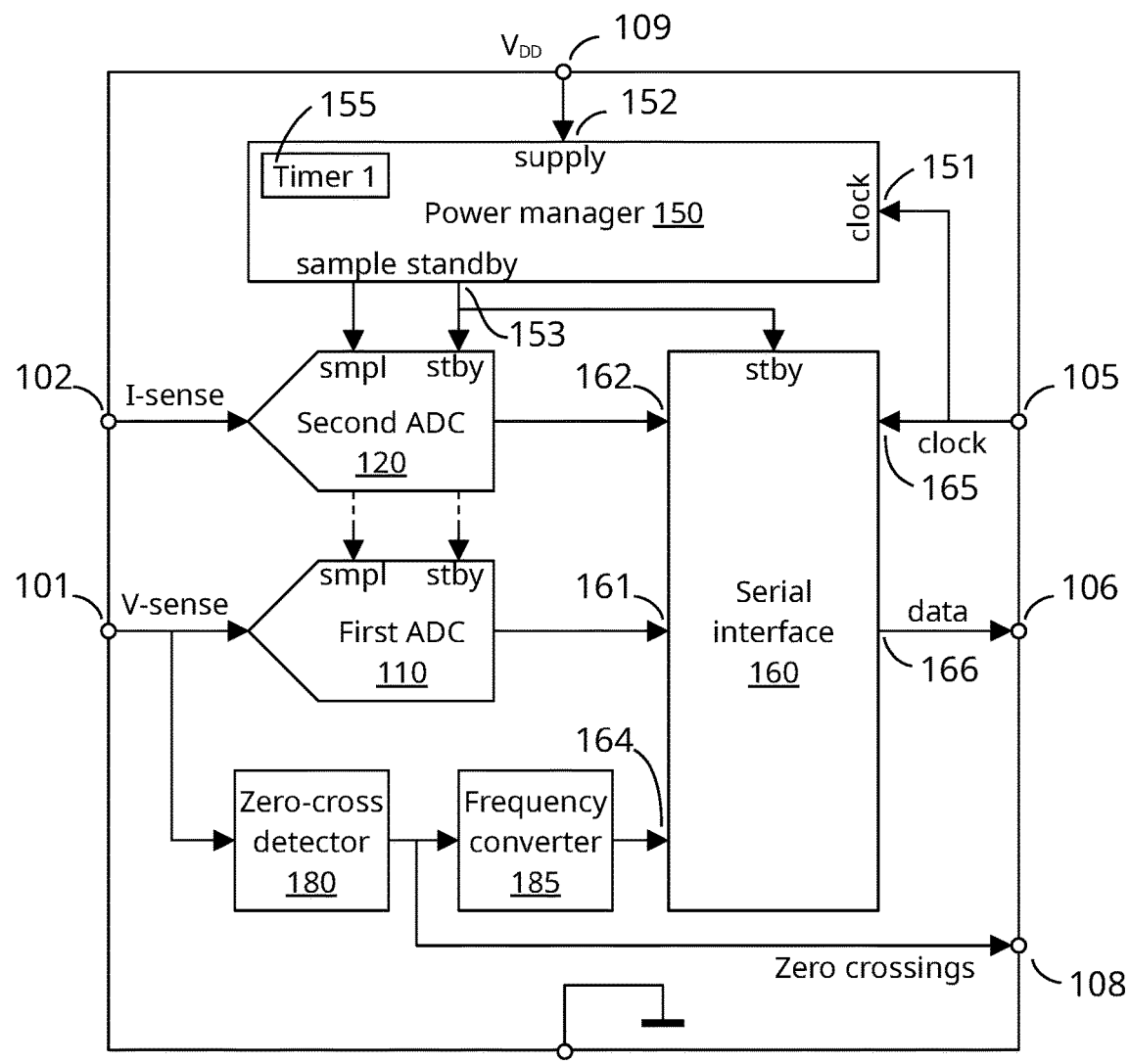
FIG. 1 - Powerline load monitor

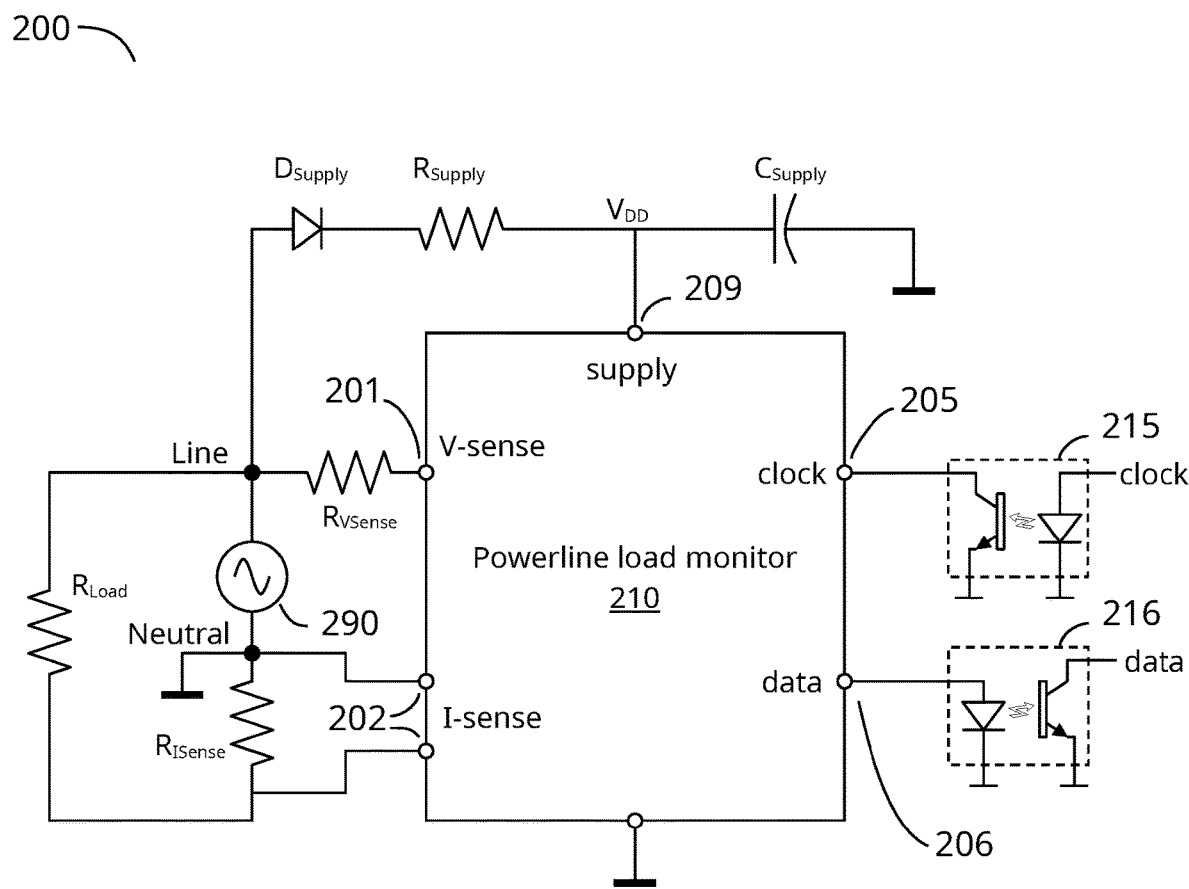
FIG. 2 - System

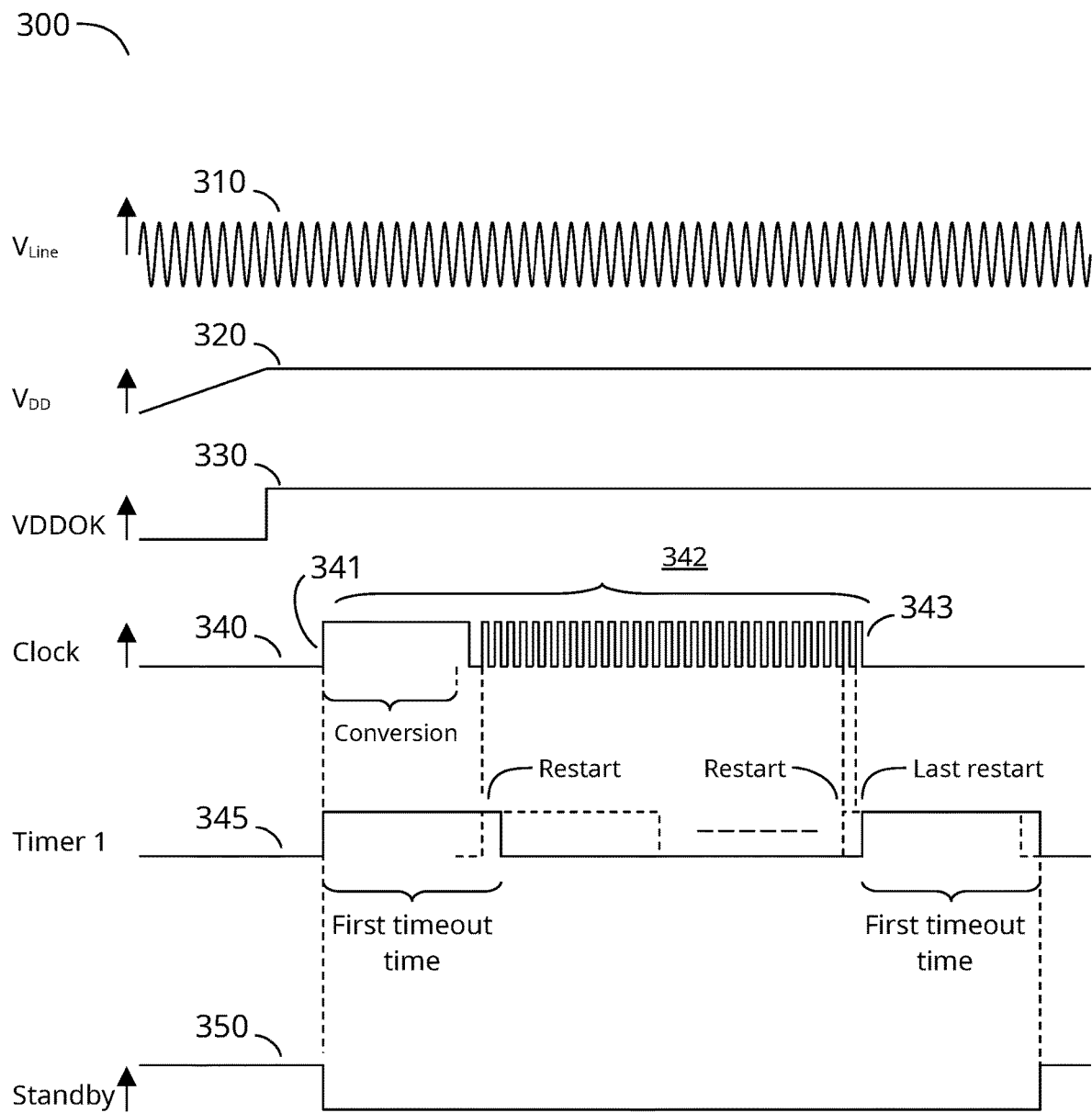
FIG. 3 - Conversion and read timing

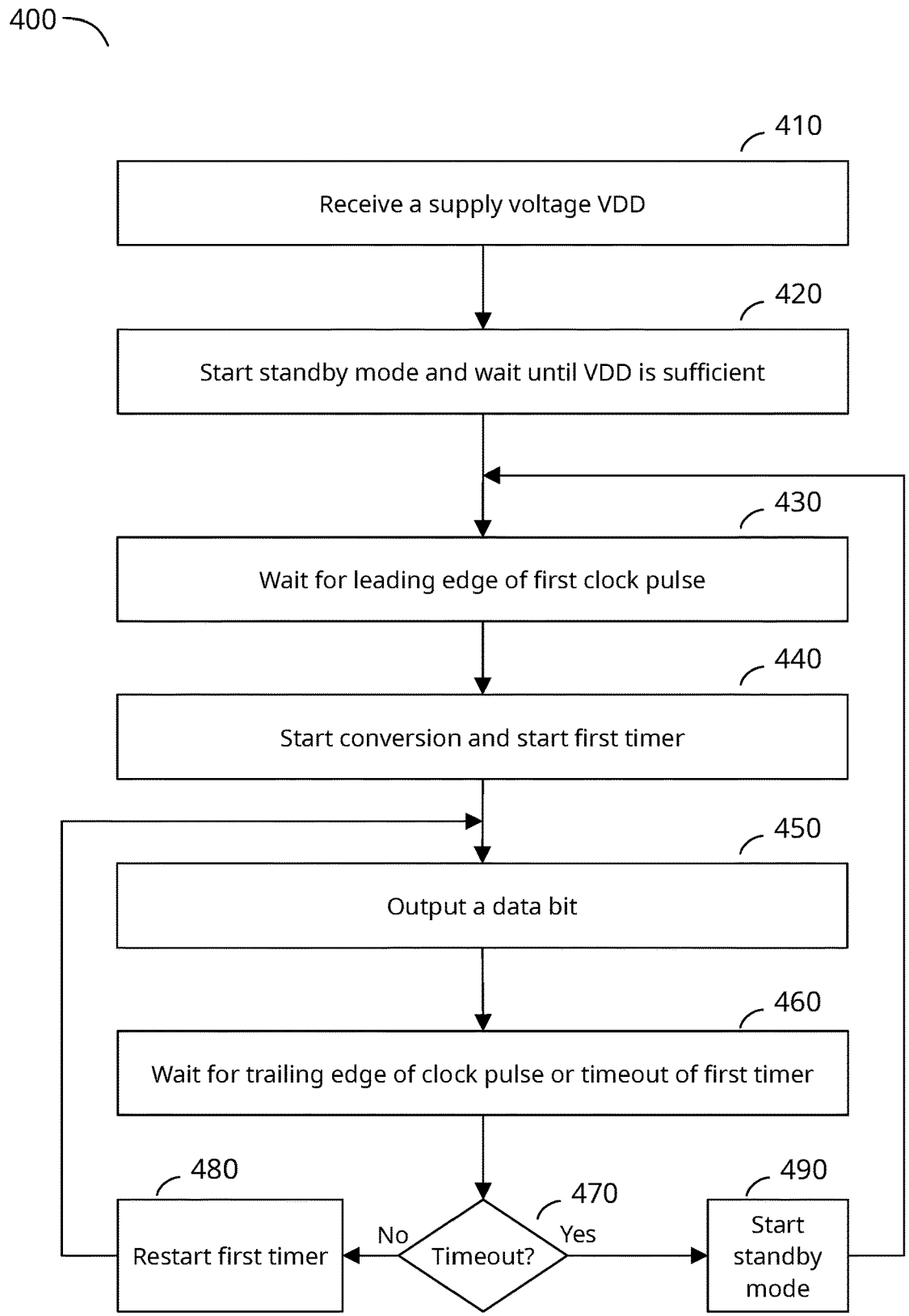
FIG. 4 - Power saving method

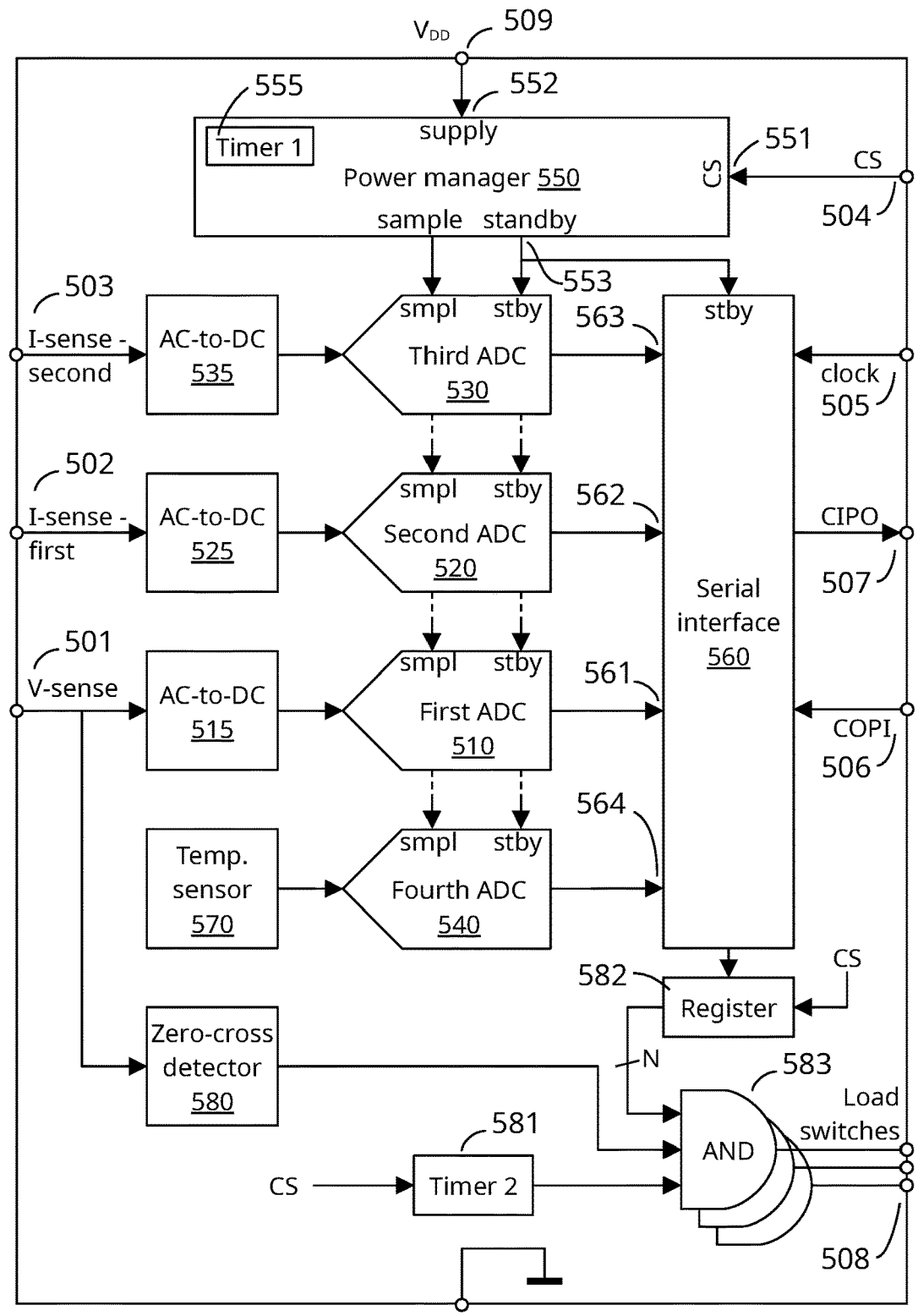
FIG. 5 - Powerline load monitor with load switch control

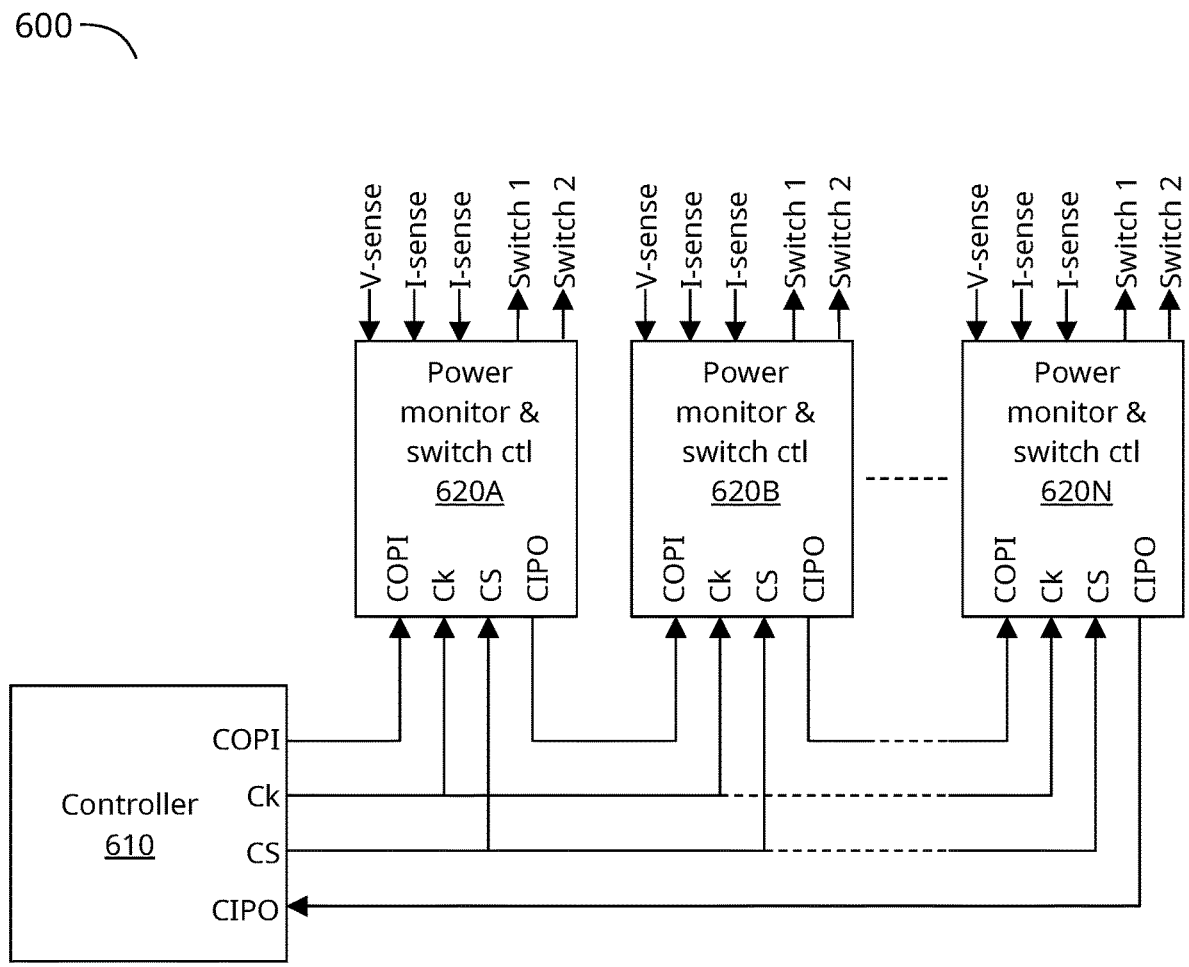
FIG. 6 - System

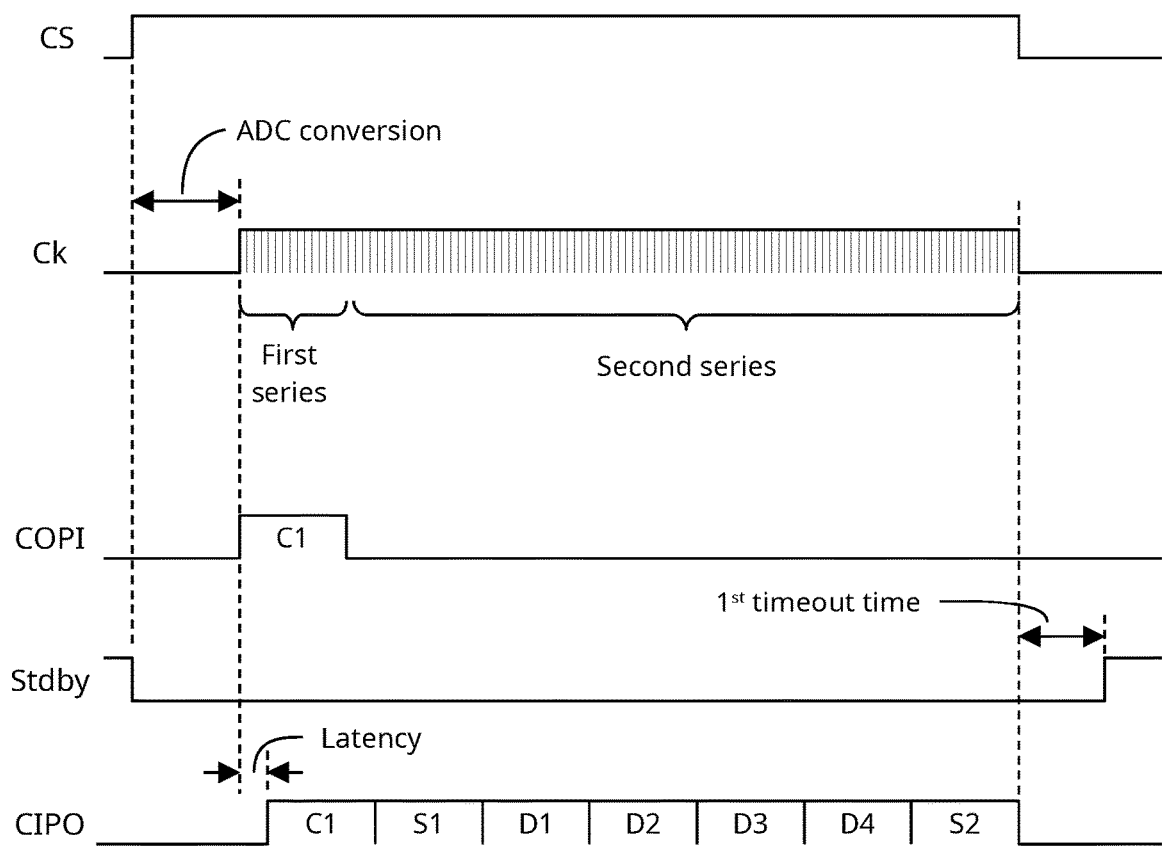
FIG. 7 - Serial clocking

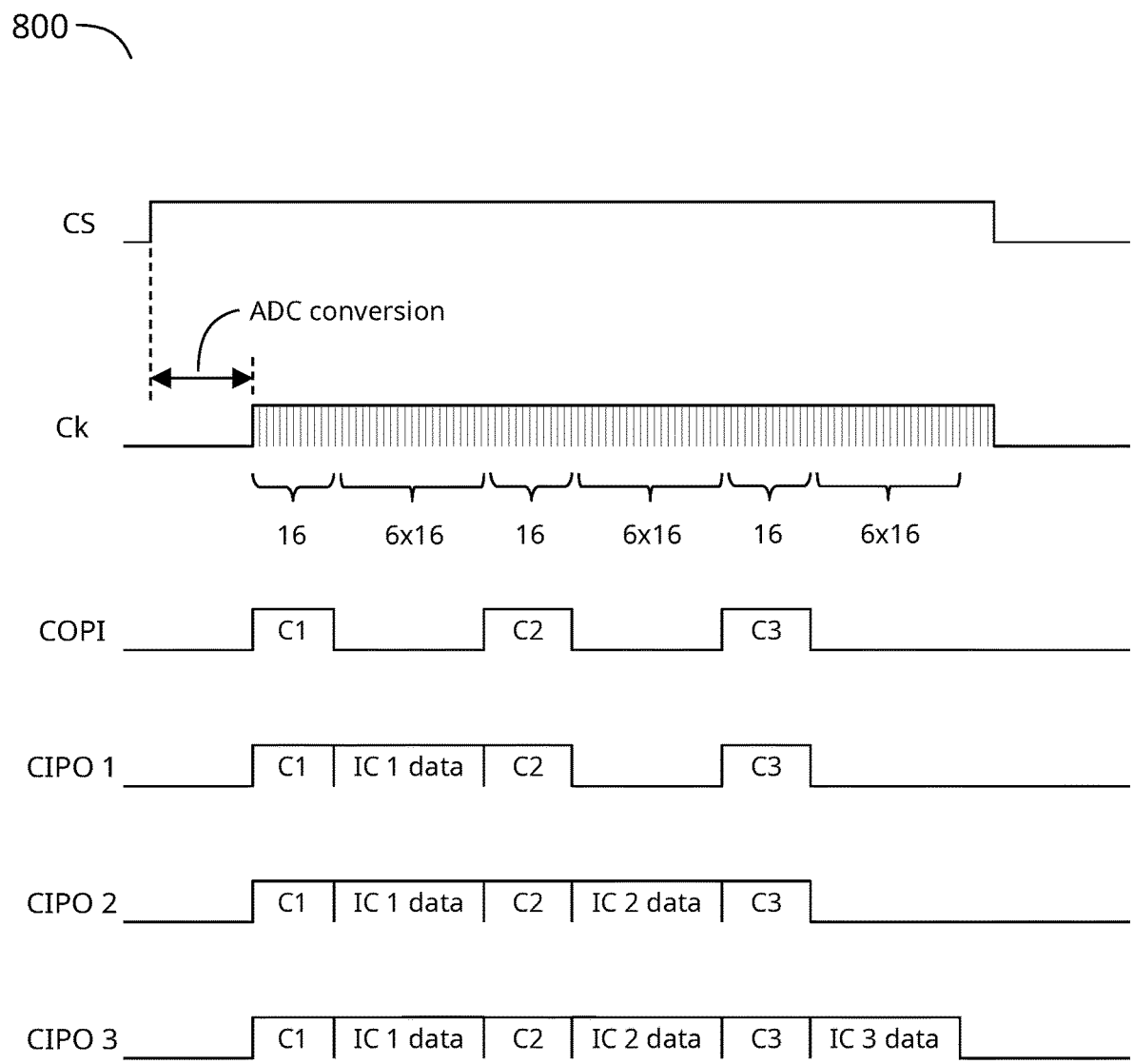
FIG. 8 - Daisy chain clocking

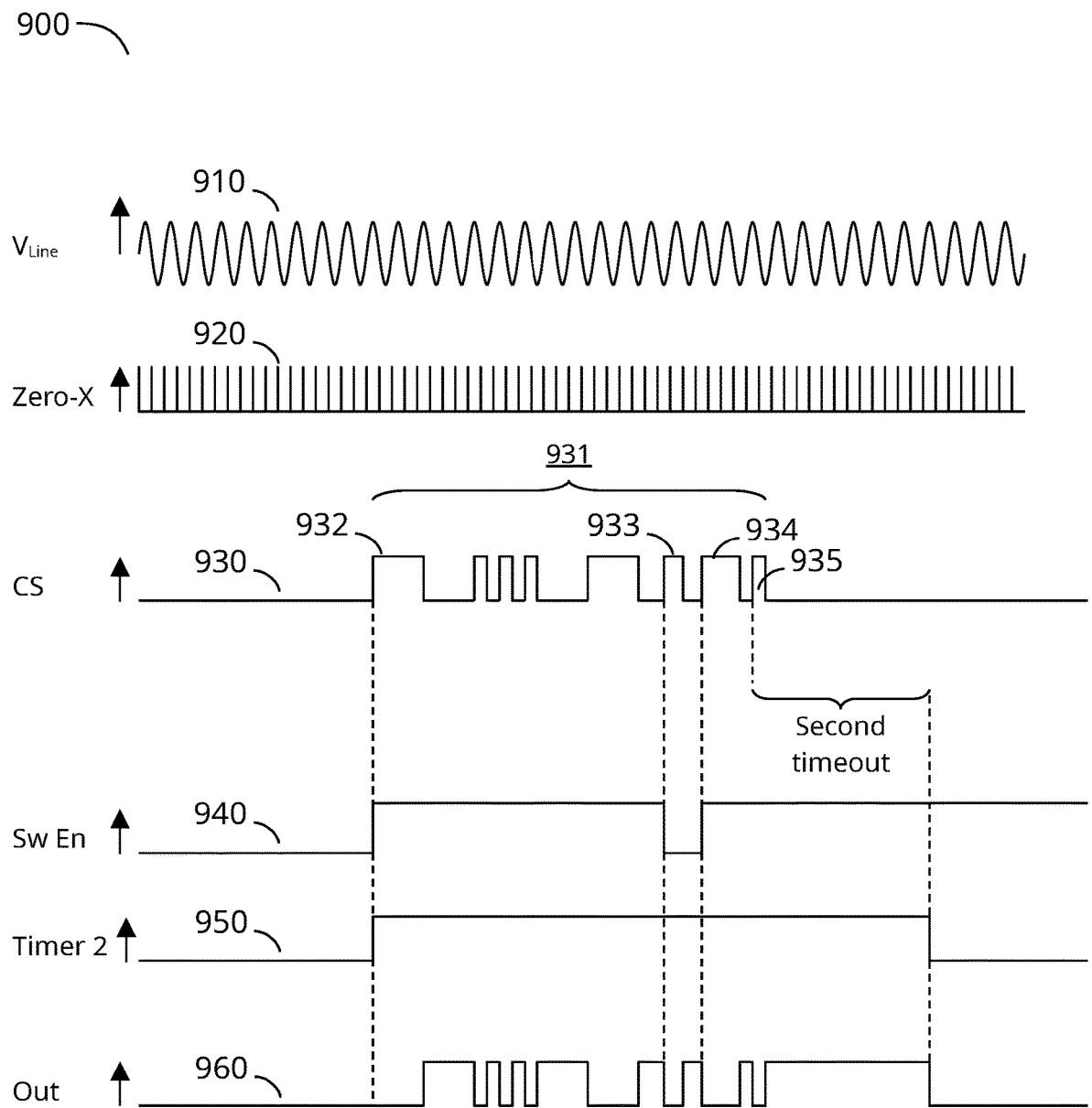
FIG. 9 - Load switch control timing

POWERLINE LOAD MONITOR AND CONTROL

CROSS REFERENCES

This application claims priority from U.S. provisional patent application Ser. No. 63/246,240, entitled Power Control and Monitor IC, filed on 20 Sep. 2021, which is hereby incorporated by reference as if set forth in full in this application for all purposes.

Each publication, patent, and/or patent application mentioned in this specification is herein incorporated by reference in its entirety to the same extent as if each individual publication and/or patent application was specifically and individually indicated to be incorporated by reference.

BACKGROUND

Technical Field

The disclosed technology relates generally to systems and methods used in power supply or regulation systems, and in particular to those for monitoring and controlling AC power.
Context Many electrical machines, appliances, and other equipment require monitoring of the electrical power supplied to them. Monitoring systems may be based on digital technology, including microprocessors. However, such technology may require significant computer processing power, resulting in higher power consumption, and complicated and/or overly expensive solutions.

SUMMARY

Implementations of the technology disclosed herein may use various analog circuits to save power in a powerline load monitor and may further use a standby mode when some circuits don't need to be active. By saving power wherever possible, the powerline load monitor can take its energy off the powerline using simple circuits, thus saving a user unnecessary cost and wasted power. Implementations of the powerline load monitors described herein use an average power of less than 10 milliwatts, i.e., a total electrical power supplied to the powerline load monitor minus a total electrical power delivered by the powerline load monitor (to devices connected to its outputs) is less than 10 (ten) milliwatts.

In a first aspect, an implementation provides a powerline load monitor. It includes a supply input, a voltage sense input, a first current sense input, a clock input, and a data output. Internally, it includes a first ADC, a second ADC, a serial interface, and a power manager. The first ADC is coupled between the voltage sense input and the serial interface. The second ADC is coupled between the first current sense input and the serial interface. The serial interface is also coupled with the clock input and the data output. The power manager is coupled with the supply input, and with the clock input. It has a standby output that is coupled with the first ADC, the second ADC, and/or the serial interface. Some implementations include a zero-crossing detector that may be coupled with a zero-crossing output and/or a frequency converter that is also coupled with the serial interface.

When the power manager receives a first clock pulse, it puts the powerline load monitor in an active mode and starts a first timer with a first timeout time. The first ADC converts a sensed voltage to a first digital value and the second ADC converts a sensed current to a second digital value. When the serial interface receives a trailing edge of a clock pulse, it outputs a data bit of the first digital value or the second digital value. When the first timer times out, the power manager puts the powerline load monitor in a standby mode to save power.

In some implementations, the powerline load monitor further includes a data input coupled with the serial interface. When the serial interface receives a first series of external clock signals it receives a first series of external data signals, and copies the first series of external data signals to the data output. The first series of external data signals may include control information. Copying may comprise a first latency of zero or more clock cycles. When the serial interface receives a second series of external clock signals, it outputs a second series of external data signals. The second series of external data signals includes status information, the first digital value, and/or the second digital value. It may output the second series of external data signal with the first latency.

In a second aspect, an implementation provides a method to save power in a powerline load monitor. The method includes the following steps. The powerline receives a supply voltage and starts a standby mode. It waits until the supply voltage has reached a sufficient level. It waits for a first clock pulse to end the standby mode, start a first timer, and activate two or more ADCs. The ADCs convert sensed signals. Upon receiving a trailing edge of a clock pulse, the powerline converter determines if the first timer has timed out. If so, it re-enters standby mode. If not, it outputs a data bit included in one of the converted sensed signals. Upon receiving additional clock pulses, the first timer is restarted and additional data bits are output.

A further understanding of the nature and the advantages of particular implementations disclosed herein may be realized by reference of the remaining portions of the specification and the attached drawings.

BRIEF DESCRIPTION OF THE DRAWINGS

The technology will be described with reference to the drawings, in which:

FIG. 1 illustrates an example powerline load monitor.

FIG. 2 illustrates an example system including a powerline, a powerline load monitor, and a load.

FIG. 3 illustrates an example of conversion and read timing of a powerline load monitor.

FIG. 4 illustrates an example method to save power in a powerline load monitor.

FIG. 5 illustrates an example powerline load monitor with load switch control.

FIG. 6 illustrates an example system that cascades multiple powerline load monitors with load switch control.

FIG. 7 illustrates an example of serial clocking in a powerline load monitor or in a powerline load monitor with load switch control.

FIG. 8 illustrates an example of daisy chain clocking in a cascade of powerline load monitors or powerline load monitors with load switch control.

FIG. 9 illustrates an example of load switch control timing.

In the figures, like reference numbers may indicate functionally similar elements. The systems and methods illustrated in the figures, and described in the Detailed Description below, may be arranged and designed in a wide variety of different implementations. Neither the figures, nor the Detailed Description, are intended to limit the scope as claimed. Instead, they merely represent examples of different implementations of the technology.

DETAILED DESCRIPTION

Many electrical machines, appliances, and other equipment require monitoring of the electrical power supplied to them. Monitoring systems may be based on digital technology, including microprocessors. However, such technology may miss fast events and require significant power, resulting in overly expensive solutions. For example, a microprocessor-based system may sample the line voltage regularly. For such a system to be able to detect a spike with a 1-millisecond duration, it needs to use a sample frequency of at least 2,000 Hz. Such a monitor would continuously sample the line at the sample frequency, resulting in a relatively high power use. A high power use is not only inefficient, it also requires a relatively expensive power supply, such as a switched-mode power supply (SMPS).

Implementations of the technology disclosed herein may use various analog circuits to save power, and may further use a standby mode when some circuits don't need to be active. By saving power wherever possible, the powerline load monitor can take its energy off the powerline using simple circuits, thus saving a user unnecessary cost and wasted power. Implementations of the powerline load monitors described herein use an average power of less than 10 milliwatts, i.e., a total electrical power supplied to the powerline load monitor minus a total electrical power delivered by the powerline load monitor (to devices connected to its outputs) is less than 10 (ten) milliwatts.

Terminology

As used herein, the phrase "one of" should be interpreted to mean exactly one of the listed items. For example, the phrase "one of A, B, and C" should be interpreted to mean any of: only A, only B, or only C.

As used herein, the phrases "at least one of" and "one or more of" should be interpreted to mean one or more items. For example, the phrase "at least one of A, B, and C" or the phrase "at least one of A, B, or C" should be interpreted to mean any combination of A, B, and/or C.

Unless otherwise specified, the use of ordinal adjectives "first", "second", "third", etc., to describe an object, merely refers to different instances or classes of the object and does not imply any ranking or sequence.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetical, or mechanical, between the things that are connected, without any intervening things or devices.

The term "configured to" perform a task or tasks is a broad recitation of structure generally meaning "having circuitry that" performs the task or tasks during operation. As such, the described item can be configured to perform the task even when the unit/circuit/component is not currently on or active. In general, the circuitry that forms the structure corresponding to "configured to" may include hardware circuits, and may further be controlled by switches, fuses, bond wires, metal masks, firmware, and/or software. Similarly, various items may be described as performing a task or tasks, for convenience in the description. Such descriptions should be interpreted as including the phrase "configured to." Reciting an item that is configured to perform one or more tasks is expressly intended not to invoke 35 U.S.C. 112, paragraph (f) interpretation for that unit/circuit/component. More generally, the recitation of any element is expressly intended not to invoke 35 U.S.C. $112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase "based on" is thus synonymous with the phrase "based at least in part on."

The terms "substantially", "close", "approximately", "near", and "about" refer to being within minus or plus 10% of an indicated value, unless explicitly specified otherwise.

The following terms or acronyms used herein are defined at least in part as follows:

ADC— analog-to-digital converter.

AC signal—an alternating current signal, i.e., a signal whose polarity reverses regularly, such as a sine wave signal.

IC—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

Powerline monitor—a circuit, that may be integrated, configured for monitoring power delivered by an AC powerline to a load. The powerline may include a line and a neutral wire. The load may be any electrical machine, appliance, or other equipment powered by electricity. By monitoring the powerline, it is possible to detect overvoltages, under-voltages, spikes, swells, droops, variations in the line frequency, and any other conditions that could be dangerous or otherwise undesirable for the load.

Load switch control—a circuit that controls one or more switches coupled with one or more loads. The switches may couple the loads with the powerline or otherwise regulate energy in the loads. The switches may be semiconductor devices such as triacs, silicon-controlled rectifiers (SCRs), power MOSFETs, thyristors, IGBTs, bipolar junction transistors (BJTs), or any other electronic or electro-mechanical devices.

Implementations

FIG. 1 illustrates an example powerline load monitor 100. Powerline load monitor 100 may be coupled with external circuits using the following terminals. A voltage sense input 101, a first current sense input 102, a clock input 105, a data output 106, a zero-crossings output 108, a supply terminal 109 to receive a supply voltage $V_{DD}$, and a ground or common terminal. Powerline load monitor 100 may include a first ADC 110 with its input coupled with voltage sense input 101, and with an output; a second ADC 120 with its input coupled with first current sense input 102, and with an output; a power manager 150 with a power manager clock input 151 coupled with clock input 105, a supply input 152 coupled with supply terminal 109, a standby output 153, a first timer 155, and a sample output or clock output to enable sampling and/or conversion of first ADC 110 and second ADC 120. Powerline load monitor 100 may further comprise a serial interface 160 with two or more outgoing data inputs (FIG. 1 shows outgoing data input 161 coupled with first ADC 110, outgoing data input 162 coupled with second ADC 120, and outgoing data input 164), a serial interface clock input 165 coupled with clock input 105, a serial interface clock output 166 coupled with data output 106, and a standby terminal (stby) coupled with standby output 153.

Optionally, powerline load monitor 100 may further comprise a zero-crossing detector 180 with an input coupled with voltage sense input 101, and an output coupled with zero-crossings output 108 and with an input of frequency converter 185, whose output is coupled with outgoing data input 164.

When powerline load monitor 100 is in operation, power manager 150 controls its operation. Power manager 150 can put powerline load monitor 100 in an active mode or in a standby mode. Some implementations have additional modes or multiple levels of standby mode. The standby mode affects operation of some of the circuits. For example, in standby mode, first ADC 110 and second ADC 120 are inactive. They may not receive power from standby output 153, or they may receive reduced power, or power manager 150 may interrupt their clocks or sample signals via a clock gating mechanism, or power manager 150 may disable them via a circuit that otherwise controls their operation. In standby mode, power manager 150 may disable other circuits too, such as serial interface 160, zero-crossing detector 180, and frequency converter 185. In active mode, power manager 150 restores their operation, so that first ADC 110 can sample a signal on voltage sense input 101 and convert it to a digital value that is passed on to outgoing data input 161, and second ADC 120 can sample a signal on first current sense input 102 and convert it to a digital value that is passed on to outgoing data input 162. Signals on voltage sense input 101 and first current sense input 102 may be AC signals shaped like a sine wave, or approximately like a sine wave, and a digital value may represent a maximum amplitude, a minimum amplitude, an average or root-mean square (RMS) amplitude, a recent maximum or minimum amplitude, or a value derived therefrom.

Power manager 150 may use first timer 155 to control standby mode, dependent on signals on clock input 105 as is described in more detail with respect to FIG. 3. Upon receiving a leading edge of a first clock pulse on clock input 105, power manager 150 puts powerline load monitor 100 in the active mode. When clock pulses don't arrive for longer than a first timeout time, determined by first timer 155, power manager 150 puts powerline load monitor 100 in standby mode: a first timeout time after receiving a leading or trailing edge of a most recent clock pulse on clock input 105, power manager 150 puts powerline load monitor 100 into standby mode. The first timeout time may be at least 25 (twenty-five) milliseconds, and at most 1,000 (one thousand) milliseconds.

Serial interface 160 takes digital values on its two or more outgoing data inputs, serializes the digital values, and outputs them bit-by-bit upon receiving successive clock signals on clock input 105, via serial interface clock output 166 for availability on data output 106. Upon receiving active edges of additional clock pulses after the first clock pulse on clock input 105, while powerline load monitor 100 is in active mode, serial interface 160 outputs successive data bits of digital values on its two or more outgoing data inputs to serial interface clock output 166.

Implementations that include zero-crossing detector 180 monitor signals on voltage sense input 101 to determine when a sensed voltage reverses polarity. In some implementations, zero-crossing detector 180 or a second zero-crossing detector monitor signals on first current sense input 102 to determine when a sensed current reverses polarity. Zero-crossing detector 180 may include a comparator to determine the polarity of its input signal, and it may include a differentiator or other pulse-shaping circuit to generate a short pulse at its output when the polarity reverses. Zero-crossing detector 180 may output its output signal directly to zero-crossings output 108, and/or it may pass on its output signal to frequency converter 185. Zero-crossing detector 180 output pulses may be shorter than 1,000 (one thousand) micro-seconds, for example as short as 1 (one) micro-second.

The frequency converter 185 takes the output signal of zero-crossing detector 180 and determines its frequency. For example, frequency converter 185 may count the number of zero crossings between two (or more) successive clock pulses on clock input 105. In some implementations, frequency converter 185 converts the frequency to a physical quantity such as a voltage or a current, and converts the physical quantity to a digital value using an ADC. It may perform the conversion of the frequency to the physical quantity in any way known in the art, including pulse shaping followed by integration.

In some implementations, powerline load monitor 100 includes further circuits like an additional current sense input coupled with serial interface 160 via a third ADC, and/or a temperature sensor coupled with serial interface 160 via a fourth ADC. It may further include one or more AC-to-DC converters. Such further circuits are described with reference to FIG. 5.

FIG. 2 illustrates an example system 200 including a powerline 290, a powerline load monitor 210, and a load ($R_{Load}$). Powerline load monitor 210 includes a voltage sense input 201, a differential current sense input 202, a clock input 205, a data output 206, and a supply terminal 209 to receive a supply voltage $V_{DD}$. In this example, powerline 290 has a Line wire and a Neutral wire, which may be coupled to a common or ground connection. The load, represented here by a resistor R_Load, is coupled with the Line wire and via a current sense resistor $R_{ISense}$ with the Neutral line. The two sides of $R_{ISense}$ are (directly or indirectly) coupled with differential current sense input 202. Some implementations may not use a $R_{ISense}$, coupled in series with powerline 290, but instead a current pickup coil or loop, a current sense transformer, a giant magneto-resistive (GMR) sensor, or a Hall-effect sensor measuring the magnetic field created by the current in one of the wires coupled to powerline 290. The pickup coil or loop, or other sensor may be directly coupled with differential current sense input 202 or with a single-ended current sense input. A voltage sense resistor $R_{VSense}$ couples the Line wire with voltage sense input 201. The supply voltage $V_{DD}$ can be derived from the Line voltage using simple circuits, such as the one drawn here that rectifies the AC voltage in a diode $D_{supply}$, and feeds rectified currents via a resistor $R_{supply}$ to supply terminal 209, where the voltage $V_{DD}$ is stabilized by a capacitor $C_{supply}$. Powerline load monitor 210 may interface with other circuits, such as an external microcontroller, via two or more optocouplers. In system 200, optocoupler 215 can receive a clock from an external microcontroller, ensure sufficient galvanic insulation, and drive clock input 205 as needed, and optocoupler 216 can receive data from data output 206, ensure sufficient galvanic insulation, and pass the data on to the external microcontroller.

FIG. 3 illustrates an example 300 of conversion and read timing of a powerline load monitor. Example 300 shows powerline voltage 310 ($V_{Line}$), which in most cases will be a sine wave, supply voltage 320 ($V_{DD}$), signal 330 may be an internal signal that $V_{DD}$ is high enough (VDDOK), clock 340 which may be the signal on clock input 105 in FIG. 1 or clock input 505 in FIG. 5, and signal 350 (standby) which may be an internal signal that indicates if the powerline load monitor is in standby mode.

When powerline voltage 310 starts, or is first applied to a system with the powerline load monitor, the supply voltage 320 $V_{DD}$, which is generated in the system from powerline voltage 310, increases until it reaches a sufficient level, indicated by internal signal 330 being asserted. At this time, the powerline load monitor can become operational. In some implementations, AC-to-DC converters sensing powerline voltage 310 and an associated current become active. In further implementations, the AC-to-DC converters include peak responding detectors and/or filters with fast attack and slow decay times. However, the powerline load monitor is in standby mode, as indicated by signal 350, indicating that ADCs and/or the serial interface are inactive to save power. A leading edge of a first clock pulse 341 in a clock train 342, received after signal 330 is asserted, ends standby mode (signal 350), starts the first timer, and triggers sampling of the sensed voltage and current(s) and conversion by the ADCs. When conversion is completed, the serial interface outputs a first bit of the conversion results on the data output (of the serial interface and the powerline load monitor). Successive clock pulse causes output of successive bits of the conversion results. Clock train 342, as drawn, has 16 clock pulses, which is enough to output two bytes of data. First clock pulse 341 must have a duration longer than the conversion time of the ADCs, and shorter than the first timeout time. Dependent on the powerline load monitor implementation, more or fewer clock pulses may be required to output measured data. Each of the clock pulses in clock train 342 restarts the first timer, so that the powerline load monitor stays in active mode. The last clock pulse 343 causes the final restart of the first timer by clock train 342, and after the first timer times out, the powerline load monitor enters standby mode again (signal 350).

The first timer 345, which may have a fixed timeout time of, for example, 100 ms, is triggered (started or restarted) each time it receives a clock pulse. Clock train 342 causes it to start a first time at first clock pulse 341 and a final time at last clock pulse 343. Each clock pulse in between restarts the first timer, so that its output remains high as long as successive clock pulses come within the fixed timeout time. Once it has timed out after last clock pulse 343, the power manager asserts standby signal 350.

Whereas example 300 shows timing of an implementation that has a single level of standby mode, other implementations may have multiple levels of standby mode. For example, when conversion by the ADCs is finished, the powerline load monitor may enter a first level of standby mode in which the ADCs become inactive, but the serial interface stays (or becomes) active. The powerline load monitor may enter a second level of standby mode after the first timer times out, and the serial interface also becomes inactive.

FIG. 4 illustrates an example method 400 to save power in a powerline load monitor. The powerline load monitor can have any of the features described with reference to FIG. 1 or FIG. 5, or any combination of the features in FIG. 1 and FIG. 5. Method 400 includes the following steps:

Step 410—receiving a supply voltage ($V_{DD}$).

Step 420—starting a standby mode and waiting until the supply voltage has reached a sufficient level.

Step 430—waiting for a leading edge of a first clock pulse (on the powerline load monitor clock input).

Step 440—ending the standby mode and activating two or more ADCs; starting conversion of sensed signals in the ADCs; and starting a first timer. An implementation may activate the two or more ADCs by providing supply power to the two or more ADCs, by supplying a clock to the two or more ADCs, or by providing a control signal that otherwise activates the two or more ADCs.

Step 450—outputting a data bit.

Step 460—waiting for a trailing edge of the first clock pulse or a timeout of the first timer (whichever comes first).

Step 470—upon receiving the trailing edge of the first clock pulse or a timeout of the first timer, determining if the first timer has timed out.

Step 480—upon determining that the first timer has not timed out, restarting the first timer on receiving a next clock pulse, and resuming method 400 at Step 450. Some implementations restart the first timer on receiving a leading edge of the next clock pulse, other implementations restart the first timer on receiving a trailing edge of the next clock pulse.

Step 490—upon determining that the first timer has timed out, entering standby mode and resuming method 400 at Step 430.

FIG. 5 illustrates an example powerline load monitor 500 with load switch control. Load switch control is an electronic circuit that can control an external switch coupled with the load, for example to switch the load on or off. Implementations use a chip select (CS) signal to communicate that a control data register contains a valid switch enable bit. The CS signal starts a watchdog timer (timer 2). When both the switch enable bit and the watchdog timer are asserted, the load switch control passes output pulses of the zero-crossing detector to the load switch control output. The watchdog timeout time may be programmable or configurable.

Powerline load monitor 500 has a voltage sense input 501, one or more current sense inputs (first current sense input 502 and second current sense input 503 have been drawn), a serial interface 560 with two or more outgoing data inputs, a clock input 505, a controller out and peripheral in input (COPI input 506, a data input), a controller in and peripheral out output (CIPO output 507), a power manager 550, and a chip select input (CS input 504).

The voltage sense input 501 is coupled with an input of first ADC 510. First current sense input 502 is coupled with an input of second ADC 520. Second current sense input 503 is coupled with an input of third ADC 530, and so on. In some implementations, coupling is direct. In other implementations, coupling is via an AC-to-DC converter. In those implementations, voltage sense input 501 is coupled with first ADC 510 via AC-to-DC converter 515, first current sense input 502 is coupled with second ADC 520 via AC-to-DC converter 525, and second current sense input 503 is coupled with third ADC 530 via AC-to-DC converter 535. and so on.

Serial interface 560 has two or more outgoing data inputs. For example, first outgoing data input 561 is coupled with an output of first ADC 510, second outgoing data input 652 is coupled with second ADC 520, and third outgoing data input 563 is coupled with third ADC 530. Some implementations include a temperature sensor. For example, temperature sensor 570 is coupled with fourth ADC 540, which is coupled with fourth outgoing data input 564.

CS input 504 is coupled with a power manager CS input 551. CS input 504 is configured to receive a CS signal, for example from an external controller as will be illustrated with reference to FIG. 6. Clock input 505 is coupled with a clock input of serial interface 560, and is configured to receive an external clock signal, for example from the external controller. The COPI input 506 is configured to receive a first external data signal. The CIPO output 507 is configured to output a second external data signal. The second external data signal may include a copy of the first external data signal, and the copy may be delayed with a latency of one or more cycles of the external clock signal.

Power manager 550 is configured to receive the CS signal from CS input 504. Power manager 550 further has a supply input 552 coupled with external supply input 509, and a standby output 553 which is coupled with the first ADC 510, second ADC 520, third ADC 530, fourth ADC 540, and/or serial interface 560. Power manager 550 puts powerline load monitor 500 in a standby mode to save power by asserting standby output 553 or in an active mode by deasserting standby output 553. Standby output 553 may output a standby signal that can be used for clock gating or power gating, or it directly outputs the power for the circuit it is connected to. Power manager 550 may derive the standby signal from the CS signal and from a first timer 555, which asserts the standby signal a first timeout time after the CS signal has been deasserted. Power manager 550 may further output a sample signal to the ADCs to start an analog to digital conversion. The sample signal may be derived from the external clock signal. First ADC 510 converts a sensed voltage to a first digital value, second ADC 520 converts a sensed current to a second digital value, and so on.

The example implementation of powerline load monitor 500 includes two current sense inputs (first current sense input 502 first current sense input 502 and second current sense input 503 second current sense input 503). Other implementations may include any other number of current sense inputs, with related AC-to-DC converters and ADCs. Whereas the current sense inputs in FIG. 5 are drawn as single-ended inputs, one or more of the current sense inputs may be differential inputs to allow for measuring any differential input signals.

AC-to-DC converter 515AC-to-DC converter 515, AC-to-DC converter 525AC-to-DC converter 525, and AC-to-DC converter 535AC-to-DC converter 535 convert the AC signals at their inputs (a voltage, a current, and a current, respectively) to DC signals. A DC signal, for example a voltage, may represent a maximum amplitude of the AC signal, a minimum amplitude, an average or root-mean square (RMS) amplitude, a recent maximum or minimum amplitude, or a value derived therefrom. In some implementations, an AC-to-DC converter may comprise a peak activated detector followed by a low-pass filter or a filter with fast attack and slow decay times. The AC-to-DC converters may be active during standby mode. This allows for fast awareness of a glitch (peak) in the AC signal even during standby mode, and the ability to detect the recent peak even if the clock at clock input 505 comes in after the event has ended.

A combinational logic circuit 583, for example including one or more three-input AND gates or equivalent, generates an output signal for one or more load switch control outputs 508 (three have been drawn). Combinational logic circuit 583 asserts an output signal when its three corresponding inputs are asserted: a load switch control enable bit for the associated load switch control output in control data register 582 is valid, second timer 581, which is started by the CS signal hasn't timed out, and a zero crossing has been detected. If there are N load switch control outputs, there are N circuits equivalent to a 3-input AND gate, and N load switch control enable bits. The zero-crossing detector 580 output is coupled with each of the one or more combinational logic circuits, and the second timer 581 output is coupled with each of the one or more combinational logic circuits.

Although the implementation in FIG. 5 shows two different timers (first timer 555 and second timer 581), some implementations use a single watchdog timer to implement both functionalities.

FIG. 6 illustrates an example system 600 that cascades multiple powerline load monitors with load switch control. System 600 comprises controller 610 and two or more instances of power monitor with load switch control 620A-N. Controller 610 has a COPI output coupled with the COPI input of power monitor with load switch control 620A. Power monitor with load switch control 620A has a CIPO output coupled with the COPI input of power monitor with load switch control 620B, and so on. Power monitor with load switch control 620N, which is the last of the cascade, has its CIPO output coupled with a CIPO input of controller 610. In this manner, controller 610 is coupled with a loop of devices power monitor with load switch control 620A-N. Controller 610 has a clock output CK that is coupled with all clock inputs of the devices in the loop power monitor with load switch control 620A-N, and a CS output that is coupled with all CS inputs of the devices in the loop. Each power monitor with load switch control 620A-N has a voltage sense input, one or more current sense inputs, and one or more load switch control outputs.

Controller 610 outputs, at its COPI output, a first series of external data signals together with a first series of external clock signals. The first series of external data signals include control information for power monitor with load switch control 620A. While controller 610 outputs a second series of external clock signals, it outputs no external data signals. Power monitor with load switch control 620A copies the first series of external data signals from its COPI input to its CIPO output, with a latency of one or more external clock signal cycles. When it receives the second series of external clock signals, it outputs a second series of external data signals, with the same latency. The second series of external data signals may include status information and/or measurement information from its voltage sense and current sense inputs.

Whereas power monitor with load switch control 620A outputs information during the second series of external clock signals, power monitor with load switch control 620B-N must know to copy this information, rather than to output their own information. Implementations have several ways of communicating this information. In a first implementation, each device in the loop has a device identification (ID), and the control information sent out by controller 610 includes the device ID to which the control information is transmitted, and whose device must output external data signals. In a second implementation, the control information includes a flag that indicates that the next device is up. The receiving device ignores the flag and the control information if it has already sent out its measurement and status data. The first device that has not sent out its measurement and status data toggles the flag and proceeds to send out its measurement and status data. In a third implementation, the flag is not included in the control information, but it is encoded in a first bit following the control information, for example the first bit of the second series of external data signals.

FIG. 7 illustrates an example 700 of serial clocking in a powerline load monitor or in a powerline load monitor with load switch control. The powerline load monitor has a CS input, a clock (Ck) input, a COPI input, and a CIPO output. Internally, it may have a standby signal (stdby) that places the powerline load monitor in a standby mode (asserted) or in an active mode (deasserted). When the CS signal on the CS input is asserted, the standby signal is deasserted and an ADC conversion cycle starts to convert sensed voltage and current values to digital values. After some time, which may be longer than the ADC conversion time, the powerline load monitor receives a first series of clock cycles on its clock input, and control information (C1) on its COPI input. For example, the control information may be included in a 16-bit word, and the first series of clock cycles includes 16 clock pulses. The powerline load monitor copies the control information C1 from its COPI input to its CIPO output, for example with a latency. Upon receiving the control information, the powerline load monitor also determines if it must respond to the control information C1 and output status and measurement data. Upon determining that it must respond, and upon receiving a second series of clock cycles, it outputs its status and measurement data on the CIPO output. For example, the powerline load monitor may output a first word of status information S1, followed by measurement data (D1-D4) of four ADCs, followed by a second word of status information S2. If each word is 16 bits, then the duration of the second series of clock pulses must be at least 6×16 bits plus the duration of the latency. The powerline load monitor asserts its standby signal a first timeout time after the CS signal is deasserted, which may be concurrent with the end of the last clock cycle.

FIG. 8 illustrates an example 800 of daisy chain clocking in a cascade of powerline load monitors or powerline load monitors with load switch control. The cascade system has a controller with a COPI output and a CIPO input. The controller further outputs a CS signal and a clock Ck. The controller is coupled with a loop of three powerline load monitors, as previously illustrated with reference to FIG. 6. A first powerline load monitor has a COPI input coupled with the controller COPI output. The second powerline load monitor has a COPI input coupled with the CIPO1 output of the first powerline load monitor. The third powerline load monitor has a COPI input coupled with the CIPO2 output of the second powerline load monitor, and a CIPO3 output coupled with the CIPO input of the controller. The powerline load monitors in this example include up to 4 ADCs, to measure up to 4 parameters, for example a sensed voltage, a first sensed current, a second sensed current, and a sensed temperature. The controller outputs 16-bit control words C1, C2, and C3, directed at the first, second, and third powerline load monitor, respectively. Each powerline load monitor outputs six 16-bit words of IC data, for example two status words and four data words. Thus, to communicate with the three powerline load monitors, the controller outputs at least three series of 7×16 clock signals, plus the clock pulses for three times the latency of a single powerline load monitor. (The latency is not shown if FIG. 8.) Concurrent with the first 16 clock cycles, the controller outputs the first control word C1 on its COPI output. It sends no information, or any type of data during the following 6×16 clock cycles. However, any data it sends may be ignored and overwritten by the first powerline load monitor, which outputs a copy of the first control word C1, followed by its status and measurement data (IC 1 data). During the following 16 clock cycles, the controller outputs the second control word C2. During the next 6×16 clock cycles, the second powerline load monitor overwrites whatever data the controller outputs and replaces it with its status and measurement data (IC 2 data). During the following 16 clock cycles, the controller outputs the third control word C3. During the next 6×16 clock cycles, the third powerline load monitor overwrites whatever data the controller outputs and replaces it with its status and measurement data (IC 3 data). Thus, the data on the CIPO3 output, which is returned to the controllers CIPO input includes both the original control words sent out by the controller and the status and measurement data of each of the three powerline load monitors.

FIG. 9 illustrates an example 900 of load switch control timing. Example 900 shows powerline voltage 910 ($V_{Line}$), which may be a sine wave, zero-crossing detector output signal 920 (Zero-X), which in this example is a train of short pulses, each occurring at the time powerline voltage 910 reverses polarity, CS signal 930, which may be applied externally, for example to CS input 504, a switch enable bit 940 in the control data (there may be as many switch enable bits in the powerline load monitor control data as there are load switch control outputs), second timer output signal 950, which is triggered and/or restarted by each active edge of a CS signal 930 pulse, and load switch control output signal 960, which may be output, for example, at load switch control outputs 508.

CS signal 930 indicates when valid control data has been written into the powerline load monitor. CS signal 930 includes CS pulse train 931, indicating multiple moments that valid strobe data is available. At some of the multiple moments, the valid control data is the same as before. At other of the multiple moments, the valid control data affects the load switch control output whose load switch control output signal 960 is shown in FIG. 9. At yet other of the multiple moments, the valid control data affects another one of the load switch control outputs. At each CS pulse, the second timer is started (or restarted).

The first CS signal pulse 932 sets switch enable bit 940 in the control data, and starts the second timer. With both the switch enable bit and the second timer activated, load switch control output signal 960 follows zero-crossing detector output signal 920. In the example timing in FIG. 9, several strobe pulses that leave switch enable bit 940 unchanged follow the first CS signal pulse 932. The CS pulse 933 signals control data that changes switch enable bit 940, disabling the output. As a result, load switch control output signal 960 no longer follows zero-crossing detector output signal 920. The next CS pulse 934 activates switch enable bit 940 again, allowing load switch control output signal 960 to once more follow zero-crossing detector output signal 920. The final CS pulse 935 (in this example CS pulse train 931) signals control data that keep switch enable bit 940 active, and as all strobe pulses, it restarts the second timer. After the second timer times out (i.e., after the second timeout time), load switch control output signal 960 is disabled and can no longer follow zero-crossing detector output signal 920.

CLAUSES

Some implementations of a powerline load monitor are only controlled by an external clock signal received on a clock input. Other implementations are controlled both by a chip select (CS) signal and an external clock signal. Those implementations may be capable of controlling external load switches through load switch control output signals on load switch control outputs. To configure which load switches are controlled, the powerline load monitors include both a data input and a data output. The availability of both a data input and a data output enables employing multiple powerline load monitors in a daisy-chained loop. Although daisy chaining and controlling load switches are not mutually dependent, some implementations may support both, and other implementations support one but not the other.

In a first aspect, an implementation provides a powerline load monitor that includes a supply input, a voltage sense input, a first current sense input, a clock input, a CS input, a controller out and peripheral in (COPI) input, and a controller in and peripheral out (CIPO) output. Internally, the powerline load monitor includes a first ADC coupled with the voltage sense input, a second ADC coupled with the current sense input, and a serial interface coupled with the first ADC, the second ADC, the clock input, the COPI input, and the CIPO output. It further includes a power manager coupled with the CS input, the supply input, the first ADC, the second ADC, and the serial interface.

When a CS input signal is asserted, the power manager deasserts a standby output signal, placing the powerline load monitor in an active mode. When the CS input signal is deasserted, the power manager waits a first timeout time and then asserts a standby output signal, placing the powerline load monitor in a standby mode.

In the active mode, the first ADC converts a sensed voltage to a first digital value, and the second ADC converts a sensed current to a second digital value. Upon receiving a first series of external clock signals, the serial interface receives control information on its COPI input and copies the control information to its CIPO output. Upon receiving a second series of external clock signals, the serial interface outputs status information and/or measurement data on its CIPO output, replacing any information it concurrently receives on its COPI input.

The powerline load monitor may further include a load switch control that includes a control data register, a timer with a second timeout time, and a combinational logic circuit. The control data register is configured to receive and store control data received by the serial interface from the COPI input. The control data includes a first switch enable bit. The second timer is started or restarted by a trailing edge of the CS signal. The combinational logic circuit includes a first input coupled with the control data register and configured to receive the first switch enable bit, a second input coupled with an output of a zero-crossing detector, and a third output coupled with an output of the timer. The combinational logic circuit asserts a load control output signal when the output signal of the zero-crossing detector is asserted, the output of the timer is asserted, and the switch enable bit is asserted.

We disclose the following clauses:
1. A powerline load monitor, comprising:
   a voltage sense input coupled with an input of a first analog-to-digital converter (a first ADC);
   a first current sense input coupled with an input of a second ADC;
   a serial interface with:
      two or more outgoing data inputs, wherein a first of the two or more outgoing data inputs is coupled with an output of the first ADC, and a second of the two or more outgoing data inputs is coupled with an output of the second ADC;
      a clock input configured to receive an external clock signal;
      a controller out and peripheral in (COPI) input configured to receive a first external data signal; and
      a controller in and peripheral out (CIPO) output configured to output a second external data signal;
   a power manager with: a chip select (power manager CS) input configured to receive a CS signal; a supply input; and a standby output coupled with at least one of the first ADC, the second ADC, or the serial interface;
   a clock input coupled with the clock input of the serial interface; and
   a CS input coupled with the power manager CS input;
   wherein, when the CS signal is asserted:
      the power manager puts the powerline load monitor in an active mode by deasserting the standby output;
      the first ADC converts a sensed voltage to a first digital value, and the second ADC converts a sensed current to a second digital value;
      while receiving a first series of external clock signals, the serial interface receives a first series of external data signals, and copies the first series of external data signals to the CIPO output, wherein the first series of external data signals includes control information and wherein copying comprises a first latency of zero or more clock cycles;
      while receiving a second series of external clock signals, the serial interface outputs a second series of external data signals, wherein the second series of external data signals includes at least one of status information or the first digital value and the second digital value and wherein outputting comprises the first latency; and
   wherein a first timeout time after the CS signal is deasserted, the power manager puts the powerline load monitor in a standby mode by asserting the standby output.
2. The powerline load monitor of clause 1, wherein:
   in the active mode, the first ADC and/or the second ADC are active; and in the standby mode, the first ADC and/or the second ADC are inactive to save power.
3. The powerline load monitor of clause 1, wherein:
   the first timeout time is at least 25 (twenty-five) milliseconds and at most 1,000 (one thousand) milliseconds.
4. The powerline load monitor of clause 1, further comprising:
   a first AC-to-DC converter coupled between the voltage sense input and the first ADC; and a second AC-to-DC converter coupled between the first current sense input and the second ADC, wherein:
   the first AC-to-DC converter and the second AC-to-DC converter remain active while the powerline load monitor is in standby mode; and
   the first AC-to-DC converter and the second AC-to-DC converter have a decay time longer than 1 (one) millisecond.

5. The powerline load monitor of clause 4, wherein:
the first AC-to-DC converter and the second AC-to-DC converter operate in continuous time.
6. The powerline load monitor of clause 1, further comprising:
a temperature sensor coupled with one of the one of the two or more outgoing data inputs of the serial interface via a third ADC.
7. The powerline load monitor of clause 1, further comprising:
one or more additional current sense inputs coupled with two or more outgoing data inputs of the serial interface via one or more additional ADCs.
8. The powerline load monitor of clause 1, further comprising:
a zero-crossing detector coupled with the voltage sense input.
9. The powerline load monitor of clause 1, wherein:
the zero-crossing detector has an output that is coupled with an AC load control output.
10. The powerline load monitor of clause 11, further comprising:
a frequency converter coupled with the output of the zero-crossing detector and one of the two or more outgoing data inputs of the serial interface, wherein:
the frequency converter counts zero crossings between two or more successive clock pulses on the clock input.
11. The powerline load monitor of clause 11, further comprising:
a frequency converter coupled with the output of the zero-crossing detector and one of the two or more outgoing data inputs of the serial interface; and
a fourth ADC coupled between the frequency convertor and one of the two or more outgoing data inputs of the serial interface;
wherein:
the frequency converter converts a frequency of zero crossings to a physical quantity measured by the fourth ADC.
12. The powerline load monitor of clause 11, further including a load switch control comprising:
a control data register configured to receive and store control data including a first switch enable bit;
a second timer with a second timeout time, wherein an input of the second timer is configured to receive the CS signal, and wherein the second timer is configured to start or restart upon receiving a trailing edge of a CS signal;
a first combinational logic circuit, including three inputs and an output, wherein a first input is coupled with the control data register and configured to receive the first switch enable bit, a second input is coupled with an output of the zero-crossing detector, a third input is coupled with an output of the second timer, and the output is coupled with a load switch control output;
wherein:
the first combinational logic circuit is configured to pass an output signal of the zero-crossing detector to the load control output only when the first switch enable bit and an output of the second timer are asserted.

CONSIDERATIONS

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, a coarse-grained reconfigurable architecture (CGRA), or in a programmable logic device such as a field-programmable gate array (FPGA), obviating the need for at least part of any dedicated hardware. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

What is claimed is:

1. A powerline load monitor, comprising:
a voltage sense input coupled with an input of a first analog-to-digital converter (a first ADC);
a first current sense input coupled with an input of a second ADC;
a serial interface with two or more outgoing data inputs, wherein a first of the two or more outgoing data inputs is coupled with an output of the first ADC, and a second of the two or more outgoing data inputs is coupled with an output of the second ADC;
a power manager with a clock input, a supply input, and a standby output coupled with at least one of the first ADC, the second ADC, or the serial interface; and
a clock input coupled with a clock input of the serial interface and with the power manager clock input;
wherein:
upon receiving a first clock pulse, the power manager puts the powerline load monitor in an active mode and trigger a first timer with a first timeout time, the first ADC converts a sensed voltage to a first digital value, and the second ADC converts a sensed current to a second digital value; and the serial interface outputs a data bit of a digital value of one of the two or more outgoing data inputs;
upon receiving additional clock pulses, the power manager triggers the first timer;
upon receiving additional clock pulses, the serial interface outputs additional data bits; and
a first timeout time after receiving a most recent clock pulse on the clock input, the power manager puts the powerline load monitor into a standby mode.

2. The powerline load monitor of claim 1, wherein:
in the active mode, the first ADC and/or the second ADC are active; and in the standby mode, the first ADC and/or the second ADC are inactive to save power.

3. The powerline load monitor of claim 1, wherein:
the first timeout time is at least 25 (twenty-five) milliseconds and at most 1,000 (one thousand) milliseconds.

4. The powerline load monitor of claim 1, further comprising:
a first AC-to-DC converter coupled between the voltage sense input and the first ADC; and a second AC-to-DC converter coupled between the first current sense input and the second ADC, wherein:
the first AC-to-DC converter and the second AC-to-DC converter remain active while the powerline load monitor is in standby mode; and
the first AC-to-DC converter and the second AC-to-DC converter have a decay time longer than 1 (one) millisecond.

5. The powerline load monitor of claim 4, wherein:
the first AC-to-DC converter and the second AC-to-DC converter operate in continuous time.

6. The powerline load monitor of claim 1, further comprising:
a temperature sensor coupled with one of the one of the two or more outgoing data inputs of the serial interface via a third ADC.

7. The powerline load monitor of claim 1, further comprising:
one or more additional current sense inputs coupled with two or more outgoing data inputs of the serial interface via one or more additional ADCs.

8. The powerline load monitor of claim 1, wherein:
a total electrical power supplied to the powerline load monitor minus a total electrical power delivered by the powerline load monitor is less than 10 (ten) milliwatts.

9. The powerline load monitor of claim 1, further comprising:
a first AC-to-DC converter coupled between the voltage sense input and the first ADC; and
a second AC-to-DC converter coupled between the first current sense input and the second ADC.

10. The powerline load monitor of claim 9, wherein:
the first AC-to-DC converter and the second AC-to-DC converter comprise a peak activated detector followed by a filter with fast attack and slow decay time.

11. The powerline load monitor of claim 1, further comprising:
a zero-crossing detector coupled with the voltage sense input.

12. The powerline load monitor of claim 11, wherein:
the zero-crossing detector outputs a pulse shorter than 1,000 (one thousand) micro-seconds upon detecting a zero crossing in a signal on the voltage sense input.

13. The powerline load monitor of claim 11, wherein:
the zero-crossing detector outputs a pulse shorter than 1,000 (one thousand) micro-seconds upon detecting a zero crossing in a signal on the first current sense input.

14. The powerline load monitor of claim 11, further comprising:
a frequency converter coupled with an output of the zero-crossing detector and one of the two or more outgoing data inputs of the serial interface, wherein:
the frequency converter counts zero crossings between two or more successive clock pulses on the clock input.

15. The powerline load monitor of claim 11, further comprising:
a frequency converter coupled with an output of the zero-crossing detector and one of the two or more outgoing data inputs of the serial interface; and
a fourth ADC coupled between the frequency convertor and one of the two or more outgoing data inputs of the serial interface;
wherein:
the frequency converter converts a frequency of zero crossings to a physical quantity measured by the fourth ADC.

16. The powerline load monitor of claim 1, further comprising:
a data input coupled with the serial interface; and
wherein:
while receiving a first series of external clock signals, the serial interface receives a first series of external data signals, and copies the first series of external data signals to the data output, wherein the first series of external data signals includes control information and wherein copying comprises a first latency of zero or more clock cycles;
while receiving a second series of external clock signals, the serial interface outputs a second series of external data signals, wherein the second series of external data signals includes at least one of status information or the first digital value and the second digital value and wherein outputting comprises the first latency.

17. A method to save power in a powerline load monitor including a power manager, comprising steps managed by the power manager as follows:
- in the powerline load monitor, receiving a supply voltage;
- in response to receiving the supply voltage, starting a standby mode to save power in two or more ADCs and waiting until the supply voltage has reached a sufficient level;
- monitoring reception of clock pulses on a clock input;
- waiting for a leading edge of a first clock pulse on the clock input;
- in response to receiving the leading edge of the first clock pulse, ending the standby mode and activating the two or more ADCs;
- sensing signals in a powerline and, in response to receiving the leading edge of the first clock pulse, starting conversion of sensed signals in the two or more ADCs and starting a first timer;
- in response to receiving the leading edge of the first clock pulse, waiting to receive a trailing edge of the first clock pulse;
- in response to receiving the trailing edge of the first clock pulse, determining if the first timer has timed out;
- upon determining that the first timer has not timed out, outputting a data bit, and restarting the first timer on receiving a next clock pulse; and
- upon determining that the first timer has timed out, entering the standby mode to save further power.

* * * * *